United States Patent
Yin et al.

(10) Patent No.: US 9,312,187 B2
(45) Date of Patent: Apr. 12, 2016

(54) SEMICONDUCTOR DEVICE AND METHOD OF MANUFACTURING THE SAME

(75) Inventors: Huaxiang Yin, Beijing (CN); Xiaolong Ma, Beijing (CN); Qiuxia Xu, Beijing (CN); Dapeng Chen, Beijing (CN)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 13/520,791

(22) PCT Filed: Apr. 11, 2012

(86) PCT No.: PCT/CN2012/000488
§ 371 (c)(1),
(2), (4) Date: Jul. 6, 2012

(87) PCT Pub. No.: WO2013/143036
PCT Pub. Date: Oct. 3, 2013

(65) Prior Publication Data
US 2013/0256808 A1    Oct. 3, 2013

(30) Foreign Application Priority Data
Mar. 27, 2012   (CN) .............................. 2012 1 083156

(51) Int. Cl.
*H01L 21/8238*   (2006.01)
*H01L 29/78*   (2006.01)

(52) U.S. Cl.
CPC .... *H01L 21/823807* (2013.01); *H01L 29/7833* (2013.01); *H01L 29/7843* (2013.01)

(58) Field of Classification Search
CPC ............. H01L 29/6659; H01L 29/7833; H01L 29/7843; H01L 21/823807; H01L 27/092
USPC .......... 257/369, 676, 690, 692, 693, 392, 288
See application file for complete search history.

(56) References Cited

U.S. PATENT DOCUMENTS

| | | | | |
|---|---|---|---|---|
| 7,288,451 | B2 * | 10/2007 | Zhu et al. | 438/228 |
| 7,569,892 | B2 * | 8/2009 | Zhu et al. | 257/369 |
| 2007/0018328 | A1 * | 1/2007 | Hierlemann et al. | 257/762 |
| 2008/0237734 | A1 * | 10/2008 | Hung et al. | 257/374 |
| 2008/0251851 | A1 * | 10/2008 | Pan et al. | 257/369 |
| 2009/0142891 | A1 * | 6/2009 | Kim et al. | 438/199 |
| 2009/0195855 | A1 * | 8/2009 | Steyn et al. | 359/290 |
| 2010/0148272 | A1 * | 6/2010 | Eda | 257/369 |
| 2012/0034749 | A1 * | 2/2012 | Lim et al. | 438/303 |

FOREIGN PATENT DOCUMENTS

| | | |
|---|---|---|
| CN | 101051624 A | 10/2007 |
| CN | 101320713 A | 12/2008 |
| CN | 102544098 A | 7/2012 |

* cited by examiner

*Primary Examiner* — Marc Armand
*Assistant Examiner* — Christina Sylvia
(74) *Attorney, Agent, or Firm* — Treasure IP Group, LLC

(57) ABSTRACT

The present invention discloses a semiconductor device, comprising a first MOSFET; a second MOSFET; a first stress liner covering the first MOSFET and having a first stress; a second stress liner covering the second MOSFET and having a second stress; wherein the second stress liner and/or the first stress liner comprise(s) a metal oxide. In accordance with the high-stress CMOS and method of manufacturing the same of the present invention, a stress layer comprising a metal oxide is formed selectively on PMOS and NMOS respectively by using a CMOS compatible process, whereby carrier mobility of the channel region is effectively enhanced and the performance of the device is improved.

9 Claims, 3 Drawing Sheets

SEMICONDUCTOR DEVICE AND METHOD OF MANUFACTURING THE SAME

CROSS REFERENCE

This application is a National Phase application of, and claims priority to, PCT Application No. PCT/CN2012/000488, filed on Apr. 11, 2012, entitled 'SEMICONDUCTOR DEVICE AND METHOD OF MANUFACTURING THE SAME', which claimed priority to Chinese Application No. CN 201210083156.1, filed on Mar. 27, 2012. Both the PCT Application and Chinese Application are incorporated herein by reference in their entireties.

FIELD OF THE INVENTION

The present invention relates to a semiconductor device and a method of manufacturing the same, and particularly to a MOSFET having a high-stress metal oxide covering layer and the method of manufacturing the same.

BACKGROUND OF THE INVENTION

From the 90 nm CMOS integrated circuit technique, Strain Channel Engineering with the purpose of enhancing carrier mobility of channel plays an increasingly important role with continuous reduction of a feature size of a device. A plurality of uniaxial process induced stress technology is used in device manufacturing process, that is, compressive stress or tensile stress is introduced in the channel direction so as to enhance the carrier mobility of channel and to enhance performance of the device. For example, for 90 nm process node, compressive stress in a PMOS device is provided by using embedded SiGe (e-SiGe) source/drain or using a (100) crystal orientation substrate in combination with a tensile stress contact etch stop layer (tCESL); for 65 nm process node, the first generation source/drain stress memorization technique (SMT$^{\times 1}$) is further adopted on the basis of the 90 nm process node, for example, a dual contact etch stop layer is used; for 45 nm process node, the second generation source/drain stress memorization technique (SMT$^{\times 2}$) is used on the basis of the previous technique, for example, e-SiGe technique may be used in combination with a tCESL or a dual CESL, besides, Stress Proximity Technique (SPT) may be used, moreover, a (110)-plane substrate is adopted for PMOS and a (100)-plane substrate is adopted for NMOS; after 32 nm process node, the third generation source/drain stress memorization technique (SMT$^{\times 3}$) is used, for example, embedded SiC source/drain is used on the basis of the previous techniques to enhance the tensile stress in a NMOS device.

Moreover, technology of introducing stress to a channel can be realized by controlling a material or a cross-section shape of a channel or spacer apart from changing the materials of the substrate or source/drain. One example is that a dual stress liner (DSL) technique can be adopted. Another example is that a tensile stress SiN$_x$ layer spacer can be adopted for a NMOS and a compressive stress spacer can be adopted for a PMOS. Still another example is that the cross-section of the embedded SiGe source/drain is manufactured as a Σ-shaped so as to improve the channel stress in PMOS.

However, the effect of these conventional stress technologies is weakened increasingly with the continuous reduction in the size of devices. For a NMOS, dislocation and offset between the thin film layers providing stress become increasingly obvious with the reduction in the feature size, which requires providing higher stress precisely while the thickness of the thin films has to be thinned. For a PMOS, carrier mobility of channel in embedded SiGe source/drain technology significantly depends on the feature size, and thereby reduction in size compromises the effect of enhancing carrier mobility greatly.

The intrinsic stress in a silicon nitride thin film is caused by inherent nature that a nitrogen-centered network structure unit in a triangle plane trends to form a silicon-centered tetrahedron network structure having low-energy valence bonds. Due to the difference in valences of these two types of atoms, a strain occurs. For SiNxHy tensile stress generation obtained by a PECVD method using ammonia gas and silane as a reactant mixture, the process mainly comprises gas-phase formation of disilane and aminosilane groups, surface reaction of these plasma products and the subsequent release of redundant hydrogen performed on the subsurface through rejection reaction of hydrogen and ammonia gas. The extended Si . . . N bond formed in this densification process will be limited by the surrounding netted structure and is thus frozen into a tensile stress state effectively.

As compared with LPCVD, there are less rejection reactions in PECVD technique because the temperature of a substrate in the PECVD technique is relatively low, thus, there are more combinations containing hydrogen in the thin film, whereby flexibility of the netted structure is enhanced and the thin film stress is reduced. Therefore, a high-temperature cure process needs to be performed to generate a dehydrogenation densification process so as to enhance the thin film stress.

However, a relatively high-temperature cure process discharges more hydrogen element, which results in relatively high thin film tensile stress. But an excessively high temperature causes loss of the low-temperature advantage of PECVD and is unfavorable for the formed structures such as the MOSFET silicide and source/drain doping.

Thus, an ultraviolet-assisted thermal processing (UVTP) technology is used for treating PECVD silicon nitride so as to enhance the thin film stress. This technology uses the photon energy of ultraviolet to help breaking the Si bond and NH bond in the thin film. Hydrogen atoms in adjacent broken bonds combine with each other to form hydrogen gas in the molecule form, and hydrogen gas diffuses from the thin film to form dangling bonds and micropores in the thin film. The dangling bonds cross link with one another to make the micropores contract so as to obtain the minimal surface energy.

However, high-temperature cure and the UVTP dehydrogenation process may cause the whole silicon nitride thin film to be tensile stressed, in the meanwhile, the silicon nitride thin film needs to be combined with a low-temperature oxide (LTO) material or a low-k (low dielectric constant, e.g. k is no more than 3.9 or 2.8) material to form an ILD layer and to influence the total k value of the ILD layer. Besides, when tensile stress and compressive stress silicon nitride thin films are integrated simultaneously in a CMOS, a great challenge is confronted in selective etching. Therefore, it is of great significance to develop a novel high stress insulation thin film of a silicon oxide type.

SUMMARY OF THE INVENTION

As stated above, the purpose of the present invention is to provide a novel CMOS that can control channel stress effectively and enhance carrier mobility so as to improve device performance and a method of manufacturing the same.

To this end, the present invention provides a semiconductor device, comprising: a first MOSFET; a second MOSFET; a first stress liner covering the first MOSFET and having a first stress; a second stress liner covering the second MOSFET and having a second stress; wherein the second stress liner and/or the first stress liner comprise(s) a metal oxide.

Wherein, the first MOSFET is different in type from the second MOSFET, and the first stress is different from the second stress.

Wherein, the metal oxide comprises at least one of a high-k material, a refractory metal oxide and an amorphous oxide semiconductor.

Wherein the high-k material comprises a hafnium based material selected from the group consisting of $HfO_2$, $HfSiO_x$, HfSiON, $HfAlO_x$, $HfTaO_x$, $HfLaO_x$, $HfAlSiO_x$, and HfLa-SiOx, a rare earth based high-k dielectric material selected from the group consisting of $ZrO_2$, $La_2O_3$, $LaAlO_3$, $TiO_2$ and $Y_2O_3$, $Al_2O_3$, or a composite layer of the above materials.

Wherein the refractory metal oxide includes but is not limited to at least one of NiOx, $WO_x$ and an iron based oxide.

Wherein the amorphous oxide semiconductor comprises an In-doped ZnO based semiconductor or other binary or multi-element amorphous oxide semiconductor; the In-doped ZnO based semiconductor comprises at least one of InGaZnO, InZnO, HfInZnO, TaInZnO, ZrInZnO, YInZnO, AlInZnO and SnInZnO, and the other binary or multi-element amorphous oxide semiconductor comprises at least one of $In_2O_3$, ZTO, ITO, ZnO and $SnO_x$.

Wherein a buffer layer is formed below the first stress liner and/or the second stress liner, or a covering layer is formed above the first stress liner and/or the second stress liner.

Wherein the buffer layer and/or covering layer comprise(s) at least one of a silicon oxide and a silicon nitride.

The present invention further provides a method of manufacturing a semiconductor device, comprising the following steps: forming a first MOSFET and a second MOSFET; selectively forming a second stress liner having a second stress on the second MOSFET; selectively forming a first stress liner having a first stress on the first MOSFET; and completing following processes, wherein the second stress liner and/or the first stress liner include(s) a metal oxide.

Wherein the first MOSFET is different in type from the second MOSFET, and the first stress is different from the second stress.

Wherein, the metal oxide comprises at least one of a high-k material, a refractory metal oxide and an amorphous oxide semiconductor.

Wherein the high-k material comprises a hafnium based material selected from the group consisting of $HfO_2$, $HfSiO_x$, HfSiON, $HfAlO_x$, $HfTaO_x$, $HfLaO_x$, $HfAlSiO_x$ and HfLa-SiOx, a rare earth based high-k dielectric material selected from the group consisting of $ZrO_2$, $La_2O_3$, $LaAlO_3$, $TiO_2$ and $Y_2O_3$, $Al_2O_3$, or a composite layer of the above materials.

Wherein the refractory metal oxide includes but is not limited to at least one of NiOx, $WO_x$ and an iron based oxide.

Wherein the amorphous oxide semiconductor comprises an In-doped ZnO based semiconductor or other binary or multi-element amorphous oxide semiconductor; the In-doped ZnO based semiconductor comprises at least one of InGaZnO, InZnO, HfInZnO, TaInZnO, ZrInZnO, YInZnO, AlInZnO and SnInZnO, and the other binary or multi-element amorphous oxide semiconductor comprises at least one of $In_2O_3$, ZTO, ITO, ZnO and $SnO_x$.

Wherein a buffer layer is formed below the first stress liner and/or the second stress liner, or a covering layer is formed above the first stress liner and/or the second stress liner.

Wherein the buffer layer and/or covering layer comprise(s) at least one of a silicon oxide and a silicon nitride.

Wherein the crystalline phase and stress value of the stress liners are adjusted through varying annealing and film forming process conditions.

Wherein the step of selectively forming a first or second stress liner comprises: depositing the first or second stress liner on the first MOSFET and the second MOSFET; and removing the second stress liner on the first MOSFET through photolithography/etching or removing the first stress liner on the second MOSFET through photolithography/etching.

Wherein the step of selectively forming a first or second stress liner comprises: using a photoresist pattern to cover the first or second MOSFET, and depositing the first or second stress liner on the exposed region which is uncovered by the photoresist pattern and removing the photoresist.

In accordance with the high-stress semiconductor device and a method of manufacturing the same of the present invention, a stress layer including a metal oxide is formed selectively on PMOS and NMOS respectively by using a CMOS compatible process, whereby the carrier mobility of a channel region is effectively enhanced and the device performance is improved.

BRIEF DESCRIPTION OF THE DRAWINGS

The technical solution of the present invention is explained in detail with reference to the following figures, wherein.

DETAILED DESCRIPTION OF THE EMBODIMENTS

The features and technical effect of the technical solution of the present invention are described hereinafter in detail with reference to the drawings in combination with illustrative embodiments. A novel MOSFET that can control channel stress effectively and enhance carrier mobility so as to improve device performance and a method of manufacturing the same are disclosed. It should be pointed out that similar reference signs represent similar structures, and the terms such as "first", "second", "top" and "bottom" in the present application are used for modifying various device structures or manufacturing procedures. These modifications, unless otherwise specified, do not imply the spatial, sequential or hierarchial relation of the modified device structures or manufacturing procedures.

Figure 3:
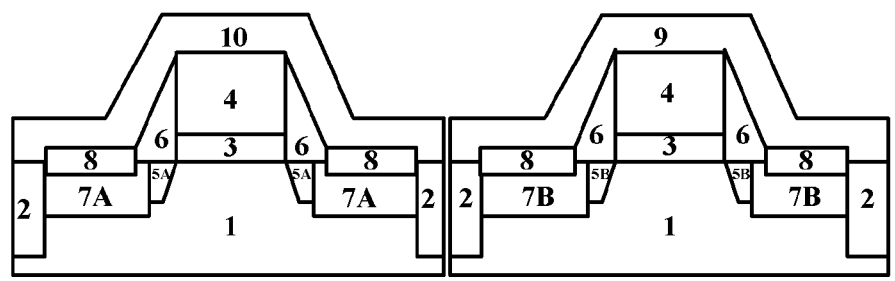
Figure 4:
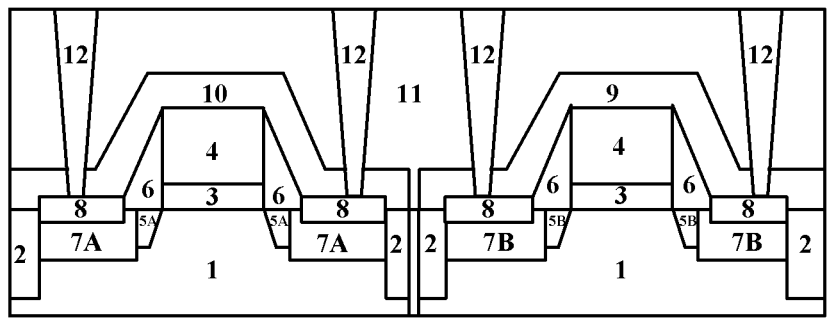
Figure 5:
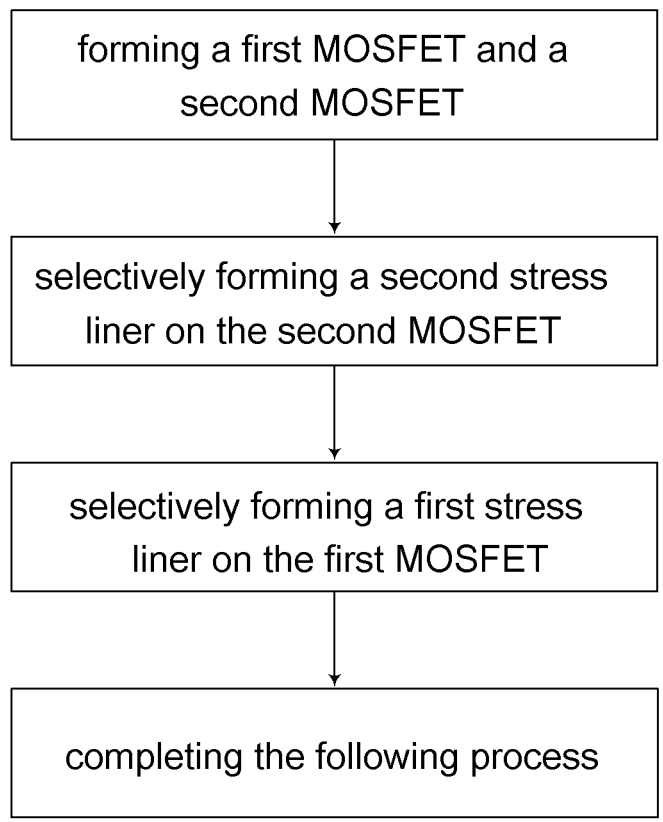
FIG. 5 is an illustrative flow chart of the manufacturing method a high-stress MOSFET according to the present invention.

The steps of the manufacturing method of a high-stress MOSFET according to the present invention are explained in detail in combination with the flow chart in FIG. 5 with reference to the cross-sectional illustrations in FIGS. 1-4.

Figure 1:
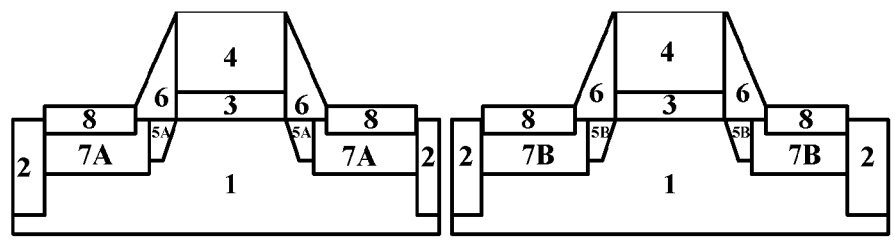
FIGS. 1-4 are cross-sectional views of the steps of the manufacturing method of a high-stress MOSFET according to the present invention.

Referring to FIG. 5 and FIG. 1, a method compatible with CMOS conventional process is adopted to form a first MOSFET and a second MOSFET. Wherein, the CMOS device structure may comprise a plurality of first MOSFET and/or a plurality of second MOSFET. It should be noted that although only the manufacturing process of CMOS is illustrated in the embodiment and figures of the present invention, similar material and process steps can be used to only form an individual PMOS or NMOS, that is, the type of the first MOSFET and the type of the second MOSFET can be the same, or different.

A substrate 1 is provided. The substrate 1 can be selected reasonably in accordance with the usage of the device, which may include monocrystalline silicon (Si), silicon on insulator (SOI), monocrystalline germanium (Ge), Ge-on-insulator (GeOI), strained Si, silicon germanium (SiGe), or a compound semiconductor material, such as GaN, GaAs, InP, InSb and carbon based semiconductor such as grapheme, SiC and carbon nanotube, etc.

A shallow trench isolation (STI) 2 is formed in the substrate 1, for instance, a shallow trench is firstly formed in the substrate 1 by photolithography/etching and then an insulating isolation material is deposited by using conventional technology such as LPCVD and PECVD and planarized using chemical mechanical polishing (CMP) until the substrate 1 is exposed, thereby forming the STI 2, wherein the filling material filled in the STI 2 may be an oxide, nitride or oxynitride. Although the first MOSFET and the second MOSFET are adjacent with each other as shown in FIG. 1 for the purpose of simplifying the description, the first and second MOSFET may adopt various proper arrangement manners such as being adjacent to, spaced from and opposite to each other in accordance with the layout requirement in practical CMOS manufacturing process. The first and second MOSFET are different in type, for example, the first MOSFET is PMOS and the second MOSFET is NMOS, or the first MOSFET is NMOS and the second MOSFET is PMOS.

A gate insulating film 3 and a gate material 4 are deposited on the surface of the whole wafer, i.e. the surface of the substrate 1 and STI 2, sequentially, and are then etched to form a gate stack structure (3/4). Wherein for gate-last process, the gate stack structure is a pseudo-gate stack structure and will be removed in the subsequent process, thus, the gate insulating film 3 is preferably a silicon oxide liner, and the pseudo-gate material 4 is preferably polysilicon, amorphous silicon or microcrystal silicon or even silicon oxide. For gate-first process, the gate stack structure will be retained in the subsequent process, thus, the gate insulating film 3 is preferably silicon oxide, nitrogen-doped silicon oxide, silicon nitride or other high-k material, the high-k material includes but is not limited to a hafnium based material selected from the group consisting of $HfO_2$, $HfSiO_x$, HfSiON, $HfAlO_x$, $HfTaO_x$, $HfLaO_x$, $HfAlSiO_x$ and HfLaSiOx (wherein the content of oxygen atoms x can be adjusted properly in accordance with the different proportions of the multi-element metal components and chemical valences, e.g. x may be 1-6 and not limited to integrals), a rare earth based high-k dielectric material selected from the group consisting of $ZrO_2$, $La_2O_3$, $LaAlO_3$, $TiO_2$ and $Y_2O_3$, $Al_2O_3$, or a composite layer of the above materials. The gate material 4 may be polysilicon, polySiGe or metal, wherein the metal may include a metal selected from the group consisting of Co, Ni, Cu, Al Pd, Pt, Ru, Re, Mo, Ta, Ti, Hf, Zr, W, Ir, Eu, Nd, Er and La, or alloys of these metals, or nitride of these metals, the gate material 4 may further be doped with elements such as C, F, N, O, B, P and As to adjust the work function. A barrier layer formed of nitride (not shown) is preferably formed between the gate conducting layer 4 and gate insulating layer 3 through conventional methods such as PVD, CVD and ALD. A material of the barrier layer is $M_xN_y$, $M_xSi_yN_z$, $M_xAl_yNz$ or $M_aAl_xSi_yN_z$, wherein M is Ta, Ti, Hf, Zr, Mo, W or other element. More preferably, the gate conducting layer 4 and the barrier layer may adopt a stacked composite layer structure, or a mixed implantation doping layer structure, that is, the materials that form the gate conducting layer 4 and the barrier layer are deposited on the gate insulating layer 3 simultaneously, thus, the gate conducting layer contains the material of the barrier layer.

Using the gate stack structure as a hard mask and spin-coating a photoresist on the first MOSFET region and/or the second MOSFET region, a first source/drain dopant implantation is performed to form a source/drain extension region 5 in the form of a lightly doped drain (LDD) structure in the substrate 1 on both sides of the gate stack structure. As shown in FIG. 1, 5A represents the source/drain extension region of the first MOSFET, and 5B represents the source/drain extension region of the second MOSFET. For NMOS, phosphorus (P), arsenic (As) and antimony (Sb) may be doped, while for PMOS, boron (B), aluminum (Al), gallium (Ga) and indium (In) may be doped.

A gate spacer 6 is formed on the two sides of the gate stack structure. For instance, a spacer material formed of silicon oxide, silicon nitride or a composite layer thereof is deposited on the surface of the device, which is then etched to form the gate spacer 6. Preferably, the gate spacer 6 also adopts a high stress silicon nitride material, e.g. the stress is lager than 1 GPa, preferably 2-4 GPa, whereby the carrier mobility of the channel region is further enhanced.

A source/drain region 7 is formed in the first MOSFET and second MOSFET regions respectively by using the gate stack structure and gate spacer as masks. The source/drain region 7 may be formed by implanting heavily doped ions into the substrate 1 in the traditional process. In a preferred embodiment of the present invention, the source/drain region 7 is an embedded stained source/drain region, i.e. etching the substrate 1 by using the gate spacer 6 as a mask to form a source/drain recess, then epitaxially growing a high stress material different from the material of the substrate 1, such as SiGe (corresponding to PMOS) or SiC (corresponding to NMOS) in the source/drain recess to form an embedded strained source/drain region of a corresponding material. Wherein the upper surface of the embedded stained source/drain region 7 is not limited to being flush with the upper surface of the substrate 1 as shown in FIG. 1, instead, it can be higher than the upper surface of the substrate 1 to form a raised source/drain. Preferably, doped ions can be implanted to the embedded stained source/drain region 7 to adjust the type and concentration. Doping is performed to the embedded source/drain of NMOS and PMOS simultaneously, wherein phosphorus (P), arsenic (As) and antimony (Sb) may be doped for NMOS, while for PMOS, boron (B), aluminum (Al), gallium (Ga) and indium (In) may be doped. Wherein, 7A represents the source/drain region of the first MOSFET, and 7B represents the source/drain region of the second MOSFET, besides, 7A/7B can also be manufactured as raised source/drain.

A self-aligned silicide process is performed by using the gate spacer 6 as a mask: depositing a thin film of a metal such as Pt, Co, Ni and Ti, etc. or a metal alloy on the surface of the whole device, then performing a high-temperature annealing treatment to make the metal and silicon contained in the embedded stained source/drain region 7A/7B react to generate source/drain contact metal silicide 8 such as $CoSi_2$, $TiSi_2$, NiSi, PtSi, NiPtSi, CoGeSi, TiGeSi and NiGeSi, whereby the performance of the device can be further enhanced. Till now, manufacturing of the first and second MOSFET has been finished with reference to the current CMOS standard process. In the following part, different strained layers are formed selectively on the first and second MOSFET.

Figure 2:
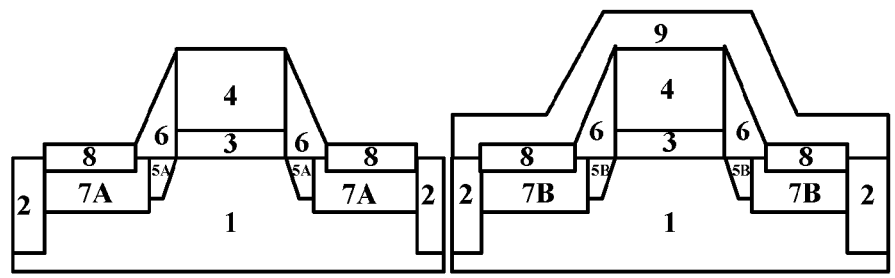

Referring to FIG. 5 and FIG. 2, a second stress liner 9 is formed selectively on the second MOSFET, covering the STI 2 of the second MOSFET, the source/drain contact metal silicide 8, the gate spacer 6 and the gate conducting layer 4. The selective depositing process, for instance, includes depositing a second stress liner on the whole wafer, then performing photolithography/etch to remove the second stress liner 9 on the first MOSFET, and only retaining the second stress liner 9 on the second MOSFET. Besides, a photoresist pattern may be used first to cover the first MOSFET region with the second MOSFET region being exposed, then the photoresist is removed after depositing the second stress liner 9, that is, the second stress liner 9 is retained only on the second MOSFET region while the second stress liner 9 is not present on the exposed first MOSFET region. For example, when the second MOSFET (on the right) is NMOS, a conventional process such as LPCVD, PECVD, HDPCVD, MOCVD or ALD is adopted to selectively deposit to form a second stress liner 9 formed of a metal oxide material, which has a second stress, e.g. tensile stress and the intensity (absolute value) of the second stress is larger than 1 GPa and between 2 GPa to 4 GPa. For instance, a transition metal oxide formed by using a sputtering, PVD or evaporation method generates a compressive stress. A specific process condition for the above method is using a metal organic oxide as the target and Ar with flow rate of 10-200 sccm, the atmospheric pressure of which is controlled at $10^{-5}$-$10^{-2}$ torr, with the RF or DC power being 50-1000W and the temperature being at 500° C. On the other hand, if the atmospheric pressure is further enhanced to a value higher than $10^{-2}$ torr, or relatively high oxygen or hydrogen gas content is introduced, a tensile stress can be generated in the metal oxide. Besides, a tensile stress can be generated by adjusting the content of hydrogen or oxygen in a metal hydride or metal oxide through the ALD, MOCVD or PECVD method. In addition, a tensile stress can be generated by using the sol-solidification method.

Specifically, the metal oxide comprises: a) a high-k material including but being not limited to a hafnium based material selected from the group consisting of $HfO_2$, $HfSiO_x$, HfSiON, $HfAlO_x$, $HfTaO_x$, $HfLaO_x$, $HfAlSiO_x$ and HfLaSiOx (wherein the content of oxygen atoms x can be adjusted properly in accordance with the different proportions of the multi-element metal components and chemical valences, e.g. x may be 1-6 and not limited to integrals), a rare earth based high-k dielectric material selected from the group consisting of $ZrO_2$, $La_2O_3$, $LaAlO_3$, $TiO_2$ and $Y_2O_3$, $Al_2O_3$, or a composite layer of the above materials; b) a refractory metal oxide including but being not limited to at least one of NiOx, $WO_x$ and an iron based oxide, such as $LnFeO_3$, $LnAMnFeO_6$, wherein Ln is Y, Pr, Nd, Sm, Gd, Tb, Dy, Ho, etc., A is Ca, Sr, etc.; c) an amorphous oxide semiconductor, such as an In-doped ZnO based semiconductor or other binary or multi-element amorphous oxide semiconductor; wherein the In-doped ZnO based semiconductor preferably comprises InGaZnO, InZnO, HfInZnO, TaInZnO, ZrInZnO, YInZnO, AlInZnO and SnInZnO, and the other binary or multi-element amorphous oxide semiconductor preferably comprises $In_2O_3$, ZTO, ITO, ZnO and SnOx; or a combination of the materials a), b) and c). Wherein, the subscript x can be properly configured and adjusted in accordance with the stress requirement of the material, for instance, for the materials in groups b) and c), x is 1-3 and not limited to integrals.

The stress mechanism of the above metal oxides is different from that of silicon nitride. The native stress may be adjusted through bond arrangement of metal elements and oxygen element as well as the doped other elements, which does not require an additional process to remove H to form a dangling bond, thus, influence on other materials of the MOSFET due to high-temperature cure and UVTP process is avoided and reliability is improved. Besides, selective etching can be performed conveniently due to adjustment of the material of the metal oxides. Thus, when applied in CMOS manufacturing, the process is simpler than a dual stress layer structure formed of a SiN material, whereby procedures can be saved and manufacturing cost can be reduced.

Preferably, while forming the metal oxide 9, at least one metal element selected from a group consisting of Co, Ni, Cu, Al, Pd, Pt, Ru, Re, Mo, Ta, Ti, Hf, Zr, W, Ir, Eu, Nd, Er and La is/are doped simultaneously (in situ) to adjust the stress. Preferably, before and/or after depositing the second stress liner 9, selective deposition is performed on the second MOSFET region to form a buffer layer 9' shown in FIG. 6 (below the second stress liner 9) and/or a covering layer (above the second stress liner 9) (not shown), the material thereof comprise silicon oxide or silicon nitride, whereby interface defects are reduced and the stress is adjusted.

Referring to FIG. 5 and FIG. 3, a first stress liner 10 is selectively formed on the first MOSFET to cover the STI 2, the source/drain contact metal silicide 8, the gate spacer 6 and the gate conducting layer 4 of the first MOSFET. Likewise, the selective depositing process, for instance, includes depositing a first stress liner on the whole wafer, then performing photolithography/etching to remove the first stress liner 10 on the second MOSFET, and only retaining the first stress liner 10 on the first MOSFET. Besides, a photoresist pattern may be used first to cover the second MOSFET region with the first MOSFET region being exposed, then the photoresist is removed after depositing the first stress liner 10, that is, the first stress liner 10 is retained only on the first MOSFET region while the second stress liner 9 instead of the first stress liner 10 is present on the exposed second MOSFET region. The material of the first stress liner 10 is similar to that of the second stress liner 9, both being the above metal oxide. However, the first stress liner 10 has a first stress different from that of the second stress liner 9 through controlling the process conditions, e.g. a compressive stress. Similarly, the first stress liner 10 also adopts the subsequent measures to adjust the stress similar to those for the second stress liner 9, e.g. the aforementioned doping metal elements, or adding a buffer/covering layer, or annealing, or adjusting the filming process.

It should be noted that, although the embodiment of the present invention enumerates the specific materials and forming method of the first stress liner 10 and the second stress liner 9 on the first and second MOSFET, those skilled in the art should know that proper adjustment may be made, for instance, the first stress liner 10 has a first stress that is a tensile stress, and the second stress liner 9 has a second stress that is a compressive stress.

Now referring to FIG. 5 and FIG. 4, the subsequent process is completed. For gate-first process, an interlayer dielectric (ILD) 11 is formed on the surface of the whole device by deposition and planarized by CMP. The ILD 11 and the first and/or second stress liner are etched respectively to form source/drain contact holes so as to expose the source/drain contact metal silicide 8 and the gate electrode contact region (not shown), contact metal is deposited to form source/drain metal plugs 12 and CMP is performed until the ILD 11 is exposed.

For gate-last process (not shown), the pseudo-gate stack material is removed after forming the first ILD and performing planarization. Then corresponding gate insulating layer and gate electrode material are filled and then planarized to remove extra part outside the gate electrode; in another example, only gate electrode material is removed and corresponding gate electrode material is filled and then planarized to remove extra part outside the gate electrode. Next, a second ILD is deposited, then an etching is performed to form source/drain contact holes penetrating the two layers of ILD and the stress liner to expose the contact region, thereafter, contact metal is deposited to form source/drain metal plugs and CMP is performed until the ILD is exposed.

The structure of the finally formed MOSFET and the CMOS device is shown in FIG. 4. Taking the gate-first process as an example, the structure comprises: a first MOSFET; a second MOSFET; a first stress liner 10 covering the first MOSFET and having a first stress; a second stress liner 9 covering the second MOSFET; wherein the second stress liner 9 and/or the first stress liner 10 comprise(s) a high-stress metal oxide.

The first and/or second MOSFET further comprise(s): a substrate 1; a gate stack structure on the substrate 1; a gate spacer 6 on both sides of the gate stack structure; a source/drain region 7 on both sides of the gate spacer 6 in the substrate 1; wherein the gate stack structure comprises a gate insulating layer 3, a gate conducting layer 4 (and a barrier layer), wherein the source/drain region 7 may be embedded strained source/drain region; the source/drain region 7 further comprises the source/drain extension region 5 along the channel direction, wherein the source/drain extension region 5 is below the gate spacer 6; wherein a source/drain contact metal silicide 8 is on the source/drain region 7; wherein source/drain metal plugs 12 pass through an ILD 11, the first stress liner 10 and the second stress liner 9 to contact the source/drain contact metal silicide 8. The material of each of the above components is as stated in the foregoing manufacturing method and not repeated here.

Besides, although the drawings of the present invention only show the CMOS schematic illustration having planar channels, those skilled in the art should know that the CMOS structure of the present invention can also be applied to other device structures, such as 3D multiple-gate, vertical channel and nanowires.

Moreover, although the device structure and forming method shown in the drawings of the present invention are applicable in gate-first process, those skilled in the art should know that different liner structures of the present invention are also applicable for gate-last process. For instance, the gate stack structure comprises a high-k material layer, a work function adjusting layer (metal and metal nitride) and a gate contact layer (conducting metal such as Al, W, Cu) stacked in sequence in the gate recess formed by etching the pseudo-gate electrode in the gate-last process, wherein the high-k material layer surrounds the underside and both sides of the work function adjusting layer, and the work function adjusting layer surrounds the underside and both sides of the gate contact layer.

Furthermore, although the CMOS manufacturing technology is taken as an example in the embodiments and drawings of the present invention, a high-stress layer of a metal oxide may also be applied to an individual PMOS or NMOS, thus, the device structure of the present invention is not limited to CMOS. Besides, the type of the first MOSFET and the second MOSFET may be the same or different, and the type (e.g. tensile stress, compressive stress) and intensity (e.g. high stress, low stress, zero stress) of the first stress and the second stress may be the same or different, which can be selected in accordance with the specific requirement for the MOSFET performance, if only one of the stress liners covering thereon comprises a metal oxide.

Figure 6:
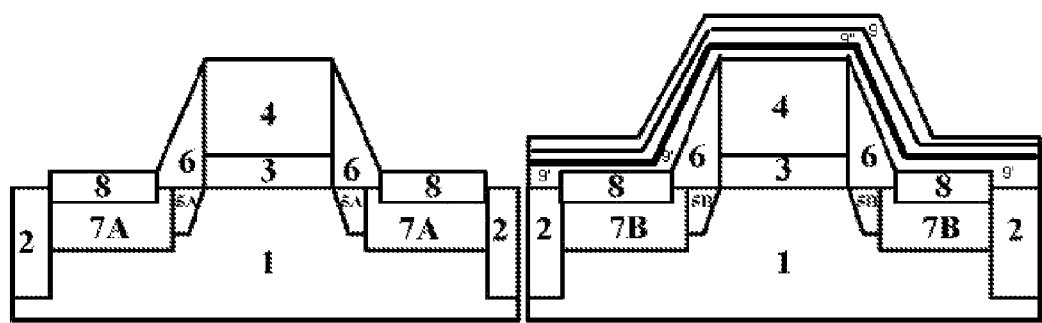
FIG. 6 is a cross-sectional view of an improvement embodiment of the high-stress MOSFET of FIG. 2 according to the present invention.

Besides, although the embodiments of the present invention enumerate that the stress liners of PMOS and NMOS are both manufactured by using a metal oxide, in practice, other materials can be used to replace the stress liner on one MOSFET therein, for instance, one of the first and second stress liners is the above metal oxide, while the other is diamond-like amorphous carbon (DLC) or silicon nitride, or the stress liner is a stack of a metal oxide 9 and DLC or silicon nitride 9" shown in FIG. 6, if only the stress liner comprises at least the above novel high-stress metal oxide.

In accordance with the high-stress CMOS of the present invention and method of manufacturing the same, a stress layer formed of a metal oxide material is formed selectively on PMOS and NMOS respectively by using a CMOS compatible process, whereby carrier mobility of the channel region is effectively enhanced and the performance of the device is improved.

Although the present invention is explained with reference to one or more illustrative embodiments, those skilled in the art know that proper modification and equivalent can be made to the device structure without departing from the scope and spirit of the invention. Besides, modifications adapted for particular situations or materials can be made based on the disclosed teachings without departing from the scope and spirit of the invention. Thus, the purpose of the present invention is not limited to particular embodiments for realizing the preferred embodiments of the present invention, instead, the disclosed device structure and method of manufacturing the same include all embodiments falling within the scope of the present invention.

We claim:

1. A method of manufacturing a semiconductor device, comprising the following steps:
   forming a first MOSFET and a second MOSFET;
   forming a second stress liner having a second stress on the second MOSFET selectively;
   forming a first stress liner having a first stress on the first MOSFET selectively; and
   forming a buffer layer below the first stress liner and/or the second stress liner to reduce interface defects and adjust the first and/or second stress; and
   completing following processes,
   wherein the second stress liner and/or the first stress liner include(s) a stack of metal oxides, including at least one of a refractory metal oxide and diamond-like amorphous carbon (DLC), and wherein the second stress liner and the first stress liner does not overlap, and
   wherein the refractory metal oxide includes an iron based oxide.

2. The method of manufacturing a semiconductor device according to claim 1, further comprising forming a covering layer above the first stress liner and/or the second stress liner.

3. The method of manufacturing a semiconductor device according to claim 2, wherein the buffer layer and/or covering layer comprise(s) at least one of a silicon oxide and a silicon nitride.

4. The method of manufacturing a semiconductor device according to claim 1, wherein the crystalline phase and stress value of the stress liners are adjusted through varying annealing and film forming process conditions.

5. The method of manufacturing a semiconductor device according to claim 1, wherein the step of selectively forming a first or second stress liner comprises:
   depositing the stress liner on the first MOSFET and the second MOSFET; and removing the second stress liner on the first MOSFET through photolithography/etching or removing the first stress liner on the second MOSFET through photolithography/etching.

6. The method of manufacturing a semiconductor device according to claim 1, wherein the step of selectively forming a first or second stress liner comprises: using a photoresist pattern to cover the first or second MOSFET; and depositing the first or second stress liner on the exposed region which is uncovered by the photoresist pattern and removing the photoresist.

7. The semiconductor device according to claim 1, wherein the first MOSFET is different in type from the second MOSFET and the first stress is different from the second stress.

8. The method of manufacturing a semiconductor device according to claim 1, wherein the first MOSFET is different in type from the second MOSFET, and the first stress is different from the second stress.

9. A method of manufacturing a semiconductor device, comprising the following steps:
forming a first MOSFET and a second MOSFET;
forming a second stress liner having a second stress on the second MOSFET selectively;
forming a first stress liner having a first stress on the first MOSFET selectively; and
forming a buffer layer below the first stress liner and/or the second stress liner to reduce interface defects and adjust the first and/or second stress; and
completing following processes,
wherein the second stress liner and/or the first stress liner include(s) a stack of amorphous oxide semiconductors and diamond-like amorphous carbon (DLC), and wherein the second stress liner and the first stress liner does not overlap, and
wherein the amorphous oxide semiconductor comprises an In-doped ZnO based semiconductor or other binary or multi-element amorphous oxide semiconductor; the In-doped ZnO based semiconductor comprises at least one of InGaZnO, InZnO, HfInZnO, TaInZnO, ZrInZnO, YInZnO, AlInZnO and SnInZnO, and the other binary or multi-element amorphous oxide semiconductor comprises at least one of In2O3, ZTO, ITO, ZnO and SnOx.

* * * * *